(12) United States Patent
Cheon et al.

(10) Patent No.: US 8,153,349 B2
(45) Date of Patent: Apr. 10, 2012

(54) POLYMER COMPOSITION, HARDMASK COMPOSITION HAVING ANTIREFLECTIVE PROPERTIES, AND ASSOCIATED METHODS

(75) Inventors: Hwan Sung Cheon, Uiwang-si (KR); Jong Seob Kim, Uiwang-si (KR); Kyong Ho Yoon, Uiwang-si (KR); Min Soo Kim, Uiwang-si (KR); Jin Kuk Lee, Uiwang-si (KR); Jee Yun Song, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 592 days.

(21) Appl. No.: 12/318,255

(22) Filed: Dec. 23, 2008

(65) Prior Publication Data
US 2009/0176165 A1   Jul. 9, 2009

(30) Foreign Application Priority Data

Dec. 24, 2007   (KR) .................. 10-2007-0136059

(51) Int. Cl.
*G03F 7/20* (2006.01)
*G03F 7/30* (2006.01)
*G03F 7/36* (2006.01)
*G03C 1/825* (2006.01)
*C08G 61/00* (2006.01)

(52) U.S. Cl. ........ 430/313; 430/311; 430/317; 430/318; 430/323; 430/325; 430/326; 528/86; 528/153; 528/212; 528/218; 525/534

(58) Field of Classification Search ................. None
See application file for complete search history.

(56) References Cited

U.S. PATENT DOCUMENTS

| 5,397,684 | A | 3/1995 | Hogan et al. |
|---|---|---|---|
| 5,536,792 | A | 7/1996 | Hogan et al. |
| 6,340,546 | B1 | 1/2002 | Sasaki |
| 6,824,952 | B1 | 11/2004 | Minsek et al. |
| 2006/0234158 | A1 | 10/2006 | Hatakeyama |
| 2006/0251990 | A1 | 11/2006 | Uh et al. |
| 2006/0269867 | A1 | 11/2006 | Uh et al. |
| 2010/0021830 | A1* | 1/2010 | Kim et al. ............ 430/5 |

FOREIGN PATENT DOCUMENTS

| JP | 2006-293207 A | 10/2006 |
|---|---|---|
| KR | 10-0519710 B1 | 9/2005 |
| KR | 10-2006-0116133 A | 11/2006 |
| KR | 10-2006-0122449 A | 11/2006 |
| KR | 10-2006-0132070 A | 12/2006 |
| KR | 10-0844019 B1 | 6/2008 |
| WO | WO 01/42331 A1 * | 6/2001 |

* cited by examiner

*Primary Examiner* — Sin J. Lee
(74) *Attorney, Agent, or Firm* — Lee & Morse, P.C.

(57) ABSTRACT

A polymer composition includes an aromatic ring-containing polymer represented by Formula 1:

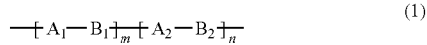

wherein m and n satisfy the relations $1 \leq m < 190$, $0 \leq n < 190$, and $1 \leq m+n < 190$.

20 Claims, 7 Drawing Sheets

FIG. 1 (Formula 1)
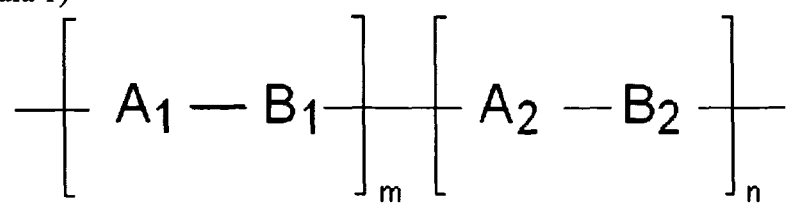
FIG. 2 ($A_1$)
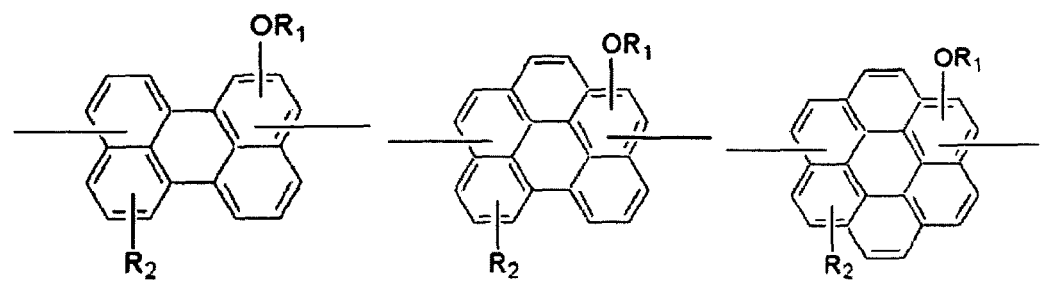

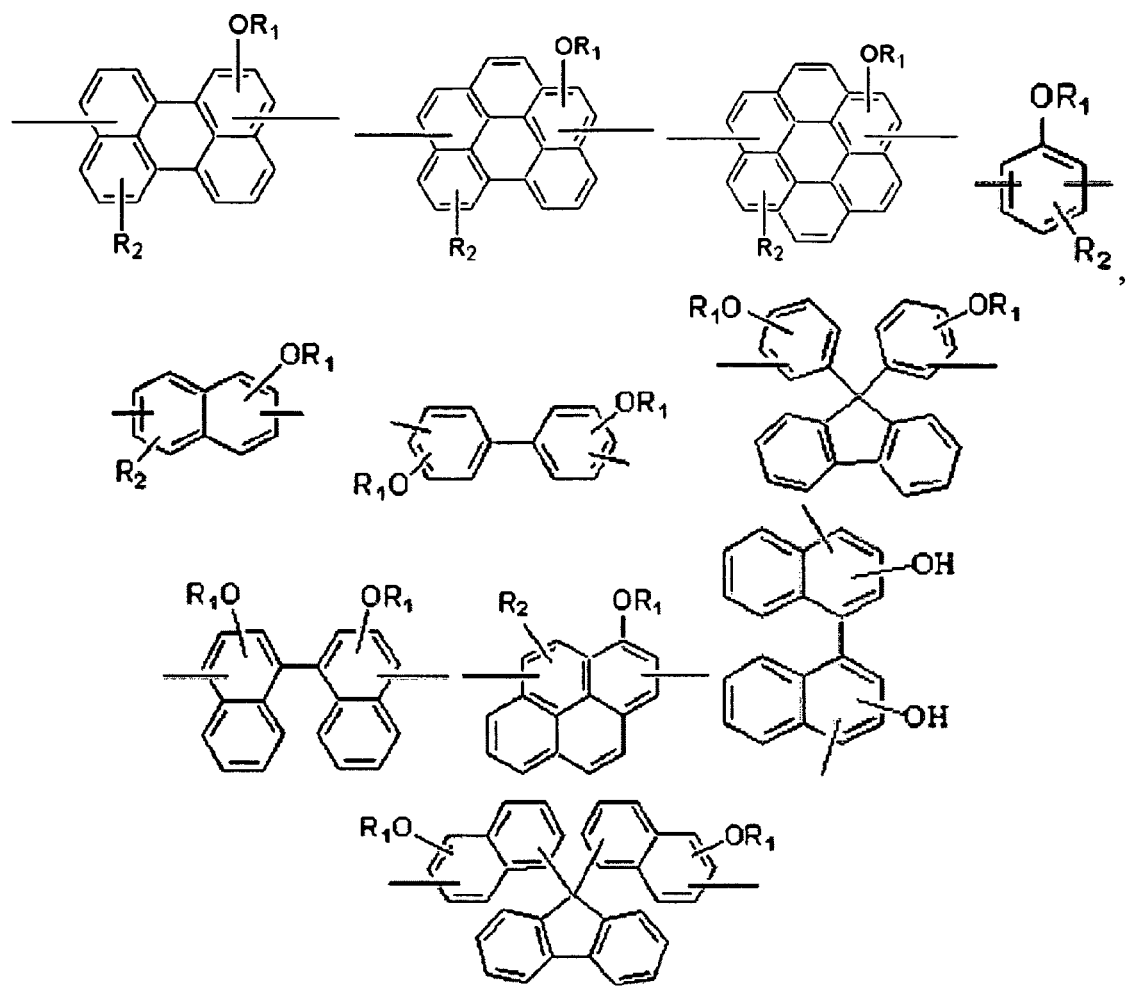
FIG. 3 (A₂)

FIG. 4 (B₁/B₂)
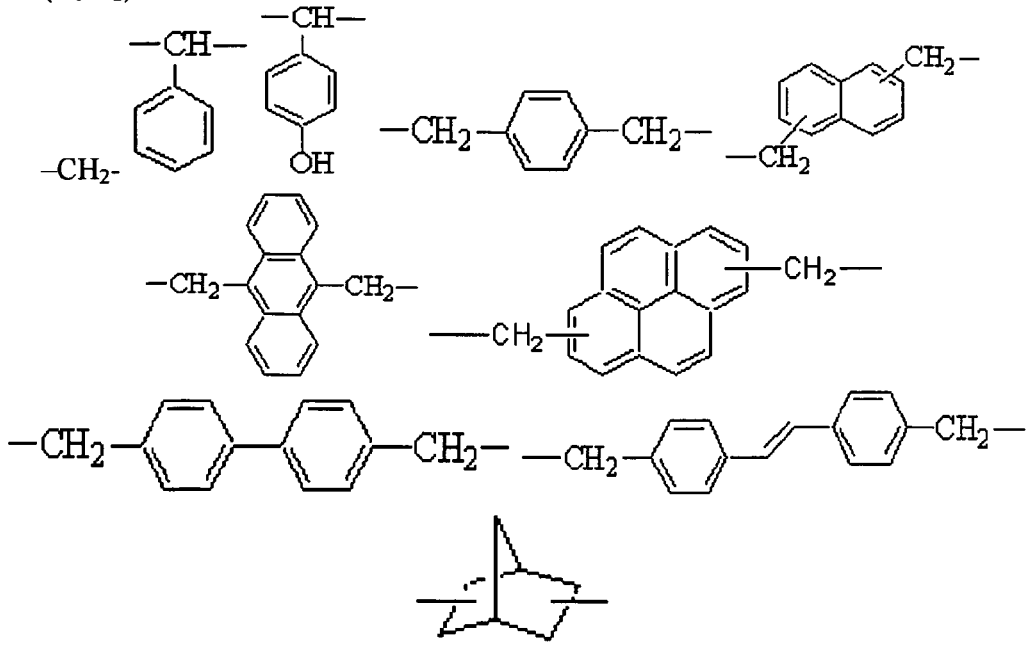
FIG. 5 (Formula 2)
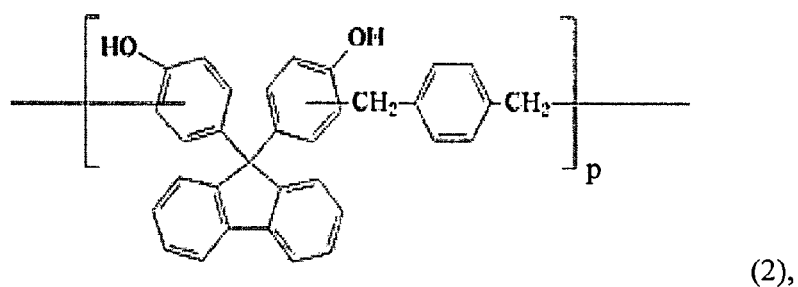
(2),
FIG. 6 (Formula 3)
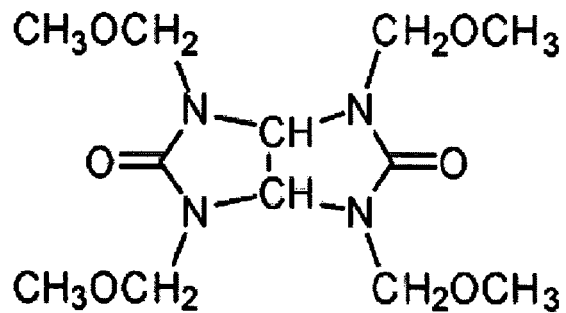

FIG. 7 (Formula 4)
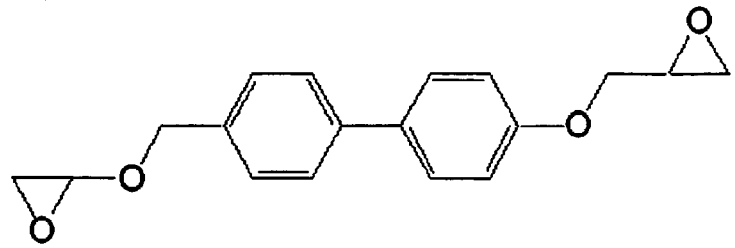
FIG. 8 (Formula 5)
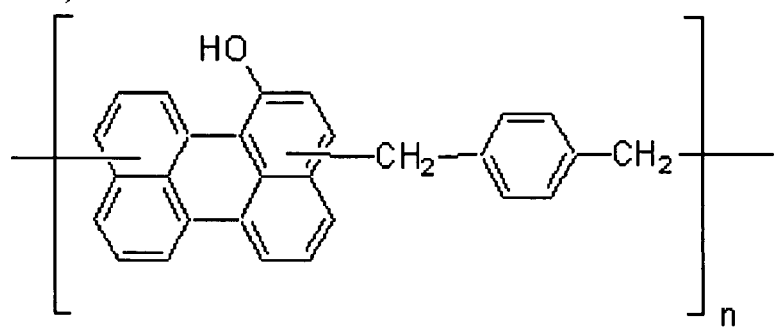
FIG. 9 (Formula 6)
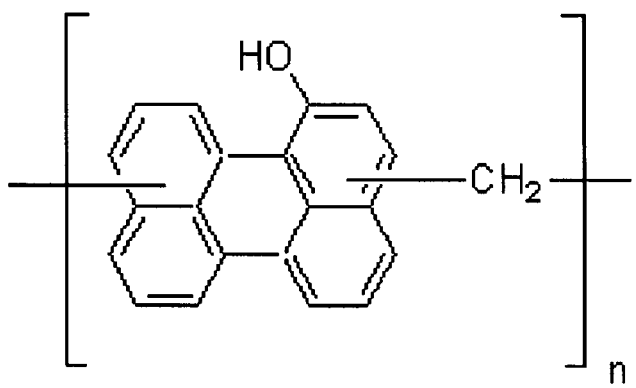
FIG. 10 (Formula 7)
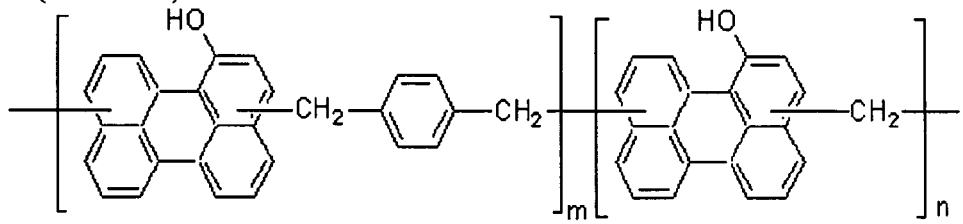

FIG. 11 (Formula 8)
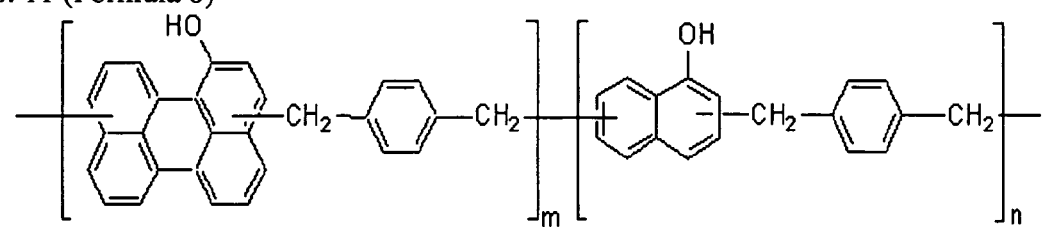
FIG. 12 (Formula 9)
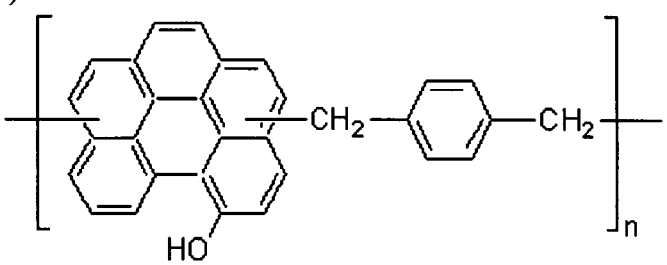
FIG. 13 (Formula 10)
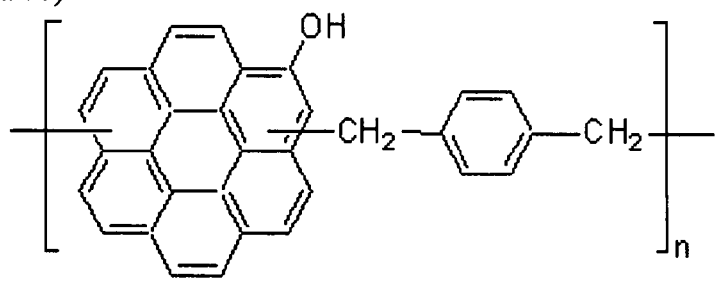

FIG. 14
Table 1: Optical properties of samples prepared in Examples and Comparative Examples

| Sample used in the formation of film | Optical properties (193 nm) | | Optical properties (248 nm) | |
| --- | --- | --- | --- | --- |
| | Refractive index (n) | Extinction coefficient (k) | Refractive index (n) | Extinction coefficient (k) |
| Comparative Example 1 | 1.44 | 0.70 | 1.97 | 0.27 |
| Example 1 | 1.50 | 0.71 | 1.74 | 0.53 |
| Example 2 | 1.49 | 0.71 | 1.68 | 0.67 |
| Example 3 | 1.49 | 0.70 | 1.70 | 0.60 |
| Example 4 | 1.45 | 0.67 | 1.79 | 0.53 |
| Example 5 | 1.52 | 0.72 | 1.78 | 0.60 |
| Example 6 | 1.53 | 0.74 | 1.72 | 0.58 |

FIG. 15
Table 2: Pattern properties of samples prepared in Examples and Comparative Examples

| Sample used in the formation of film | Pattern properties | | |
|---|---|---|---|
| | EL margin (Δ mJ/exposure energy mJ) | DoF margin (μm) | Profile |
| Comparative Example 2 | 0.1 | 0.1 | Undercut |
| Example 7 | 0.3 | 0.3 | Cubic |
| Example 8 | 0.3 | 0.3 | Cubic |
| Example 9 | 0.3 | 0.3 | Cubic |
| Example 10 | 0.3 | 0.3 | Cubic |
| Example 11 | 0.3 | 0.3 | Cubic |
| Example 12 | 0.3 | 0.3 | Cubic |

FIG. 16
Table 3: Pattern profiles of samples prepared in Examples and Comparative Examples

| Sample used in the formation of film | Pattern profile after etching |
|---|---|
| Comparative Example 3 | Tapered, rough surface |
| Example 13 | Vertical |
| Example 14 | Vertical |
| Example 15 | Vertical |
| Example 16 | Vertical |
| Example 17 | Vertical |
| Example 18 | Vertical |

POLYMER COMPOSITION, HARDMASK COMPOSITION HAVING ANTIREFLECTIVE PROPERTIES, AND ASSOCIATED METHODS

BACKGROUND OF THE INVENTION

1. Field of the Invention

Embodiments relate to a polymer composition, a hardmask composition having antireflective properties, and associated methods. More specifically, embodiments relate to a hardmask composition including at least one aromatic ring-containing polymer with a strong absorption in the short wavelength region (e.g., 157 nm, 193 nm and 248 nm).

2. Description of the Related Art

There is a continuous demand to reduce the size of structural shapes in the microelectronics industry and other related industries, including the manufacture of microscopic structures (e.g., micromachines and magneto-resist heads). In the microelectronics industry, there exists a need to reduce the size of microelectronic devices in order to increase a number of circuits in a given chip size.

For better resolution in some lithographic processes, an antireflective coating (ARC) may be used to minimize the reflectivity between an imaging layer, e.g., a radiation-sensitive resist material layer, and an underlying layer. However, since many portions of the imaging layer are removed during etching of the ARC after patterning, patterning may be further required in the subsequent etching step.

In other words, in some lithographic imaging processes, the resist may not provide resistance to the subsequent etching step to an extent sufficient to effectively transfer the desired pattern to a layer underlying the resist. In actual applications (e.g., in the case where an ultra-thin resist layer is required, an underlying material to be etched is thick, a large etching depth is needed, and/or the use of a particular etchant is required depending on the type of an underlying material), a 'hardmask layer' may be used as an intermediate layer between the patterned resist layer and the underlying material to be patterned by transfer from the patterned resist. The hardmask layer should be able to receive the pattern from the patterned resist layer and withstand etching required to transfer the pattern to the underlying material. Thus, a hardmask composition that may be etched with high etch selectively through an overlying photoresist or overlying layer materials (in case of a multilayer etching process) as a mask, while being resistant to etching necessary to pattern an underlying layer, particularly, an underlying metal layer, through a hardmask as a mask would be desirable.

Although a number of hardmask materials, e.g., amorphous carbon layers, are known, there is a continuous need for an improved hardmask composition. Since conventional hardmask materials may be difficult to apply to substrates, the use of chemical and physical vapor deposition, special solvents, and/or high-temperature baking may be required. Further, there may be difficulty in controlling contamination from particles when conventional hardmask materials are formed by deposition. Thus, a hardmask composition that can be applied by a spin-coating technique without the necessity of high-temperature baking would be desirable. A hardmask composition that provides superior storage properties, can be applied by a spin-coating technique and avoids unwanted interactions (e.g., acid pollution from a hardmask) with an imaging resist layer would further be desirable. A hardmask composition that has particular optical properties against imaging radiation at shorter wavelengths (e.g., 157 nm, 193 nm, and 248 nm) would also be desirable.

SUMMARY OF THE INVENTION

Embodiments are therefore directed to a polymer composition, a hardmask composition with antireflective properties, and associated methods, which substantially overcome one or more of the problems due to the limitations and disadvantages of the related art.

It is therefore a feature of an embodiment to provide a hardmask having antireflective properties.

It is another feature of an embodiment to provide a hardmask having high etch selectivity.

It is another feature of an embodiment to provide a hardmask having excellent resistance to multiple etching steps.

It is another feature of an embodiment to provide a hardmask composition that can be applied by a spin coating technique without the necessity of high temperature baking.

It is another feature of an embodiment to provide a hardmask composition having superior storage properties.

At least one of the above and other features and advantages of these and other embodiments may be realized by providing a polymer composition, including an aromatic ring-containing polymer represented by Formula 1:

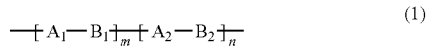

wherein m and n satisfy the relations $1 \leq m < 190$, $0 \leq n < 190$, and $1 \leq m+n < 190$, $A_1$ includes at least one of

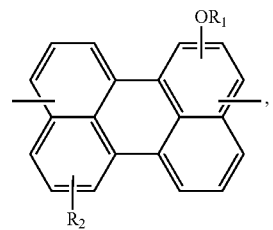

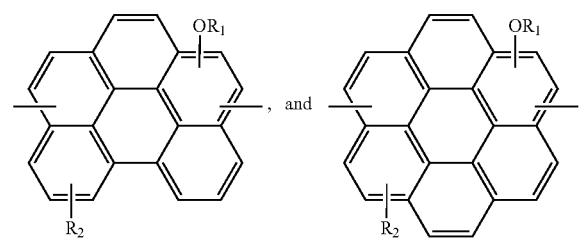

in which each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group (—$NH_2$), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), $A_2$ includes at least one of

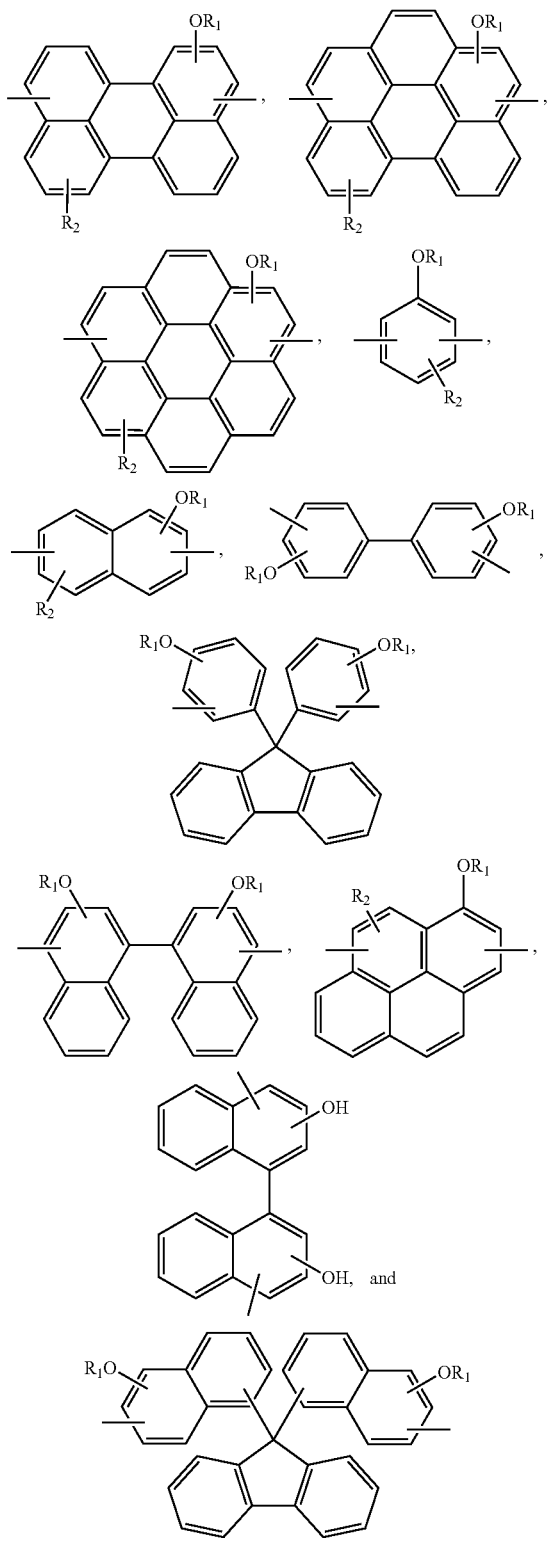

(in which each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group (—$NH_2$), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), and $B_1$ and $B_2$ each independently include at least one of —$CH_2$—,

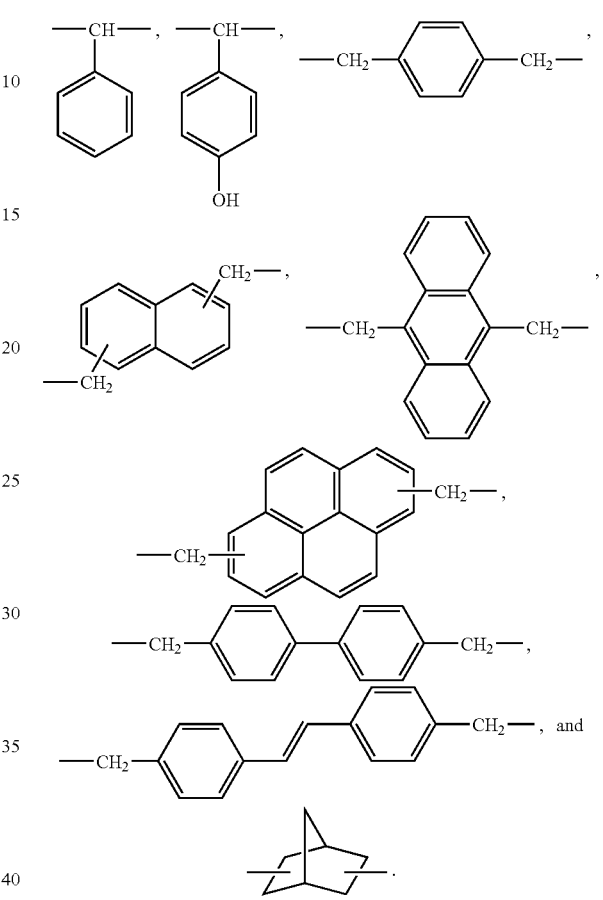

The polymer composition may further include an aromatic ring-containing polymer represented by Formula 2:

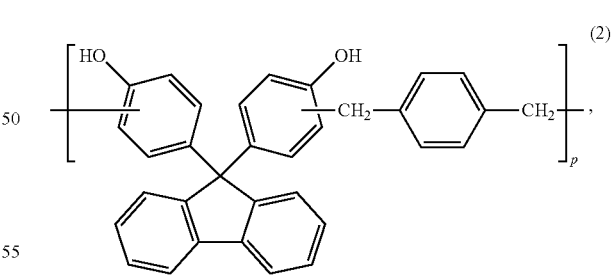

wherein $1 \leq p < 190$, the composition includes about 10 to about 90% by weight of the aromatic ring-containing polymer represented by Formula 1, and about 10 to about 90% by weight of the aromatic ring-containing polymer represented by Formula 2

At least one of the above and other features and advantages of these and other embodiments may also be realized by providing a hardmask composition with antireflective properties, including a polymer composition, including an aromatic ring-containing polymer represented by Formula 1:

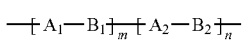  (1)

wherein m and n satisfy the relations $1 \leq m < 190$, $0 \leq n < 190$, and $1 \leq m+n < 190$, $A_1$ includes at least one of

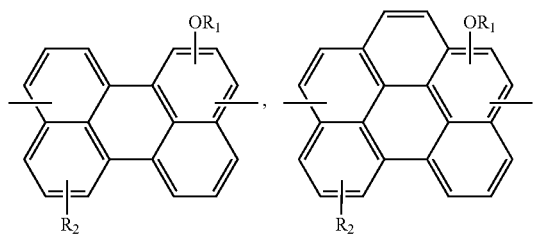

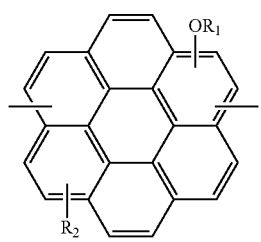

(in which each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group (—$NH_2$), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), $A_2$ includes at least one of

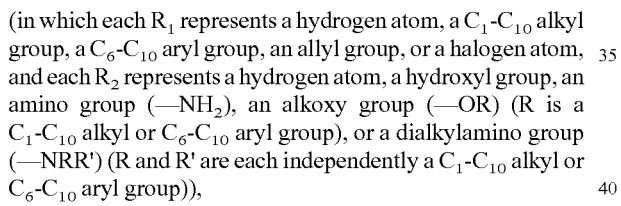

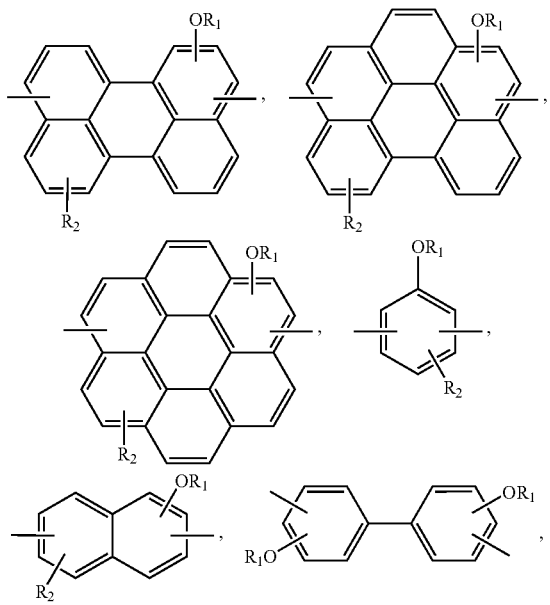

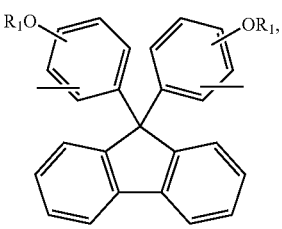

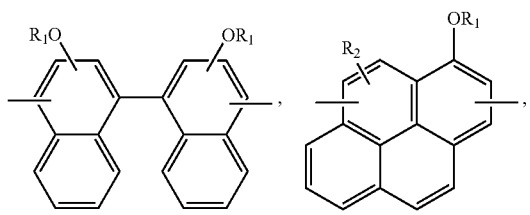

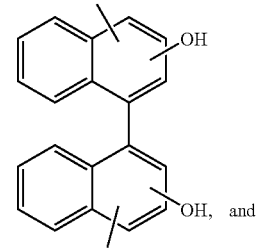

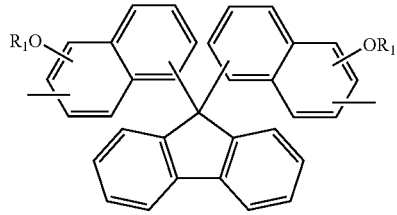

(in which each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group (—$NH_2$), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), and $B_1$ and $B_2$ each independently include at least one of —$CH_2$—,

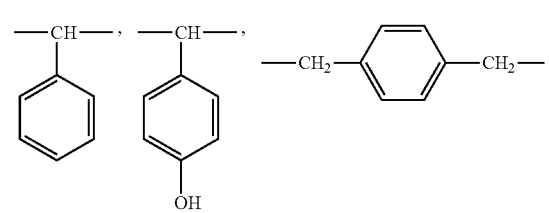

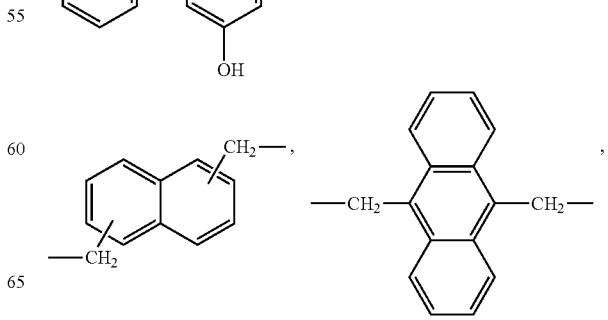

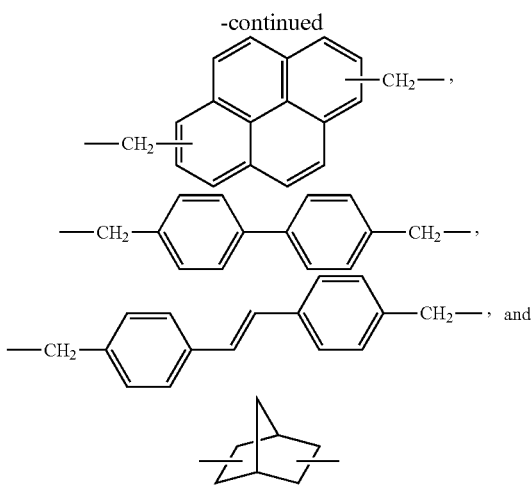

and an organic solvent.

The polymer composition may further include an aromatic ring-containing polymer represented by Formula 2:

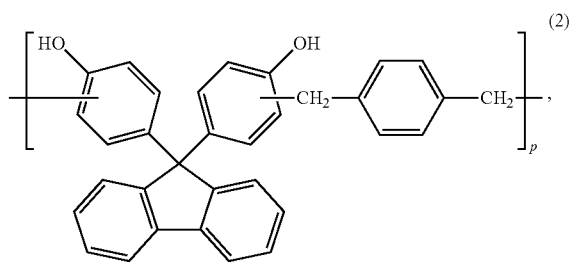

wherein $1 \leq p < 190$.

A weight ratio of the polymer of Formula 1 to the polymer of Formula 2 may be about 1:9 to about 9:1

One or both of the polymers of Formula 1 and Formula 2 may have a weight average molecular weight of about 1,000 to about 30,000.

The hardmask composition may further include a surfactant.

The hardmask composition may further include a crosslinking component and an acid catalyst.

The hardmask composition may include about 1 to about 20% by weight of the polymer composition, about 75 to about 98.8% by weight of the organic solvent, about 0.1 to about 5% by weight of the crosslinking component, and about 0.001 to about 0.05% by weight of the acid catalyst.

The crosslinking component may include at least one of melamine resins, amino resins, glycoluril compounds, and bisepoxy compounds.

The acid catalyst may include at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

At least one of the above and other features and advantages of these and other embodiments may also be realized by providing a method for patterning a material on a substrate, the method comprising providing a material layer on a substrate, forming an antireflective hardmask layer using the hardmask composition of an embodiment on the material layer, forming a radiation-sensitive imaging layer on the antireflective hardmask layer, patternwise exposing the radiation-sensitive imaging layer to radiation to form a pattern of radiation-exposed regions in the imaging layer, selectively removing portions of the radiation-sensitive imaging layer and the antireflective hardmask layer to expose portions of the material layer, and etching the exposed portions of the material layer to pattern the material layer.

The method may further include forming a silicon-containing hardmask layer prior to forming a radiation-sensitive imaging layer on the antireflective hardmask layer.

The method may further include forming a bottom antireflective coating (BARC) layer on the silicon-containing hardmask layer prior to forming a radiation-sensitive imaging layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 1 illustrates Formula 1, representing an aromatic ring-containing polymer of an embodiment;

FIG. 2 illustrates representative examples of component A1 of the aromatic ring-containing polymer of FIG. 1;

FIG. 3 illustrates representative examples of component A2 of the aromatic ring-containing polymer of FIG. 1;

FIG. 4 illustrates representative examples of components B1 and B2 of the aromatic ring-containing polymer of FIG. 1;

FIG. 5 illustrates Formula 2, representing an aromatic ring-containing polymer of an embodiment;

FIG. 6 illustrates Formula 3, representing an example of a crosslinking component of an embodiment, Powderlink 1174;

FIG. 7 illustrates formula 4, an example of a bisepoxy compound, a crosslinking component of an embodiment;

FIG. 8 illustrates Formula 5, representing an example of a component of an aromatic ring-containing polymer of an embodiment;

FIG. 9 illustrates Formula 6, representing an example of a component of an aromatic ring-containing polymer of an embodiment;

FIG. 10 illustrates Formula 7, representing an example of an aromatic ring-containing polymer of an embodiment;

FIG. 11 illustrates Formula 8, representing an example of an aromatic ring-containing polymer of an embodiment;

FIG. 12 illustrates Formula 9, representing an example of a component of an aromatic ring-containing polymer of an embodiment;

FIG. 13 illustrates Formula 10, representing an example of a component of an aromatic ring-containing polymer of an embodiment;

FIG. 14 illustrates Table 1 listing optical properties for samples prepared in the Comparative Examples and Examples;

FIG. 15 illustrates Table 2 listing pattern properties for samples prepared in the Comparative Examples and Examples; and FIG. 16 illustrates Table 3 listing pattern profiles for samples prepared in the Comparative Examples and Examples.

DETAILED DESCRIPTION OF THE INVENTION

Korean Patent Application No. 10-2007-0136059, filed on Dec. 24, 2007, in the Korean Intellectual Property Office, and entitled: "Hardmask Composition Having Antireflective Properties and Method of Patterning Material Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a crosslinking component" may represent a single compound, e.g., a melamine resin, or multiple compounds in combination, e.g., a melamine resin mixed with a glycoluril compound.

As used herein, molecular weights of polymeric materials are weight average molecular weights, unless otherwise indicated.

Embodiments provide an aromatic ring-containing polymer represented by Formula 1:

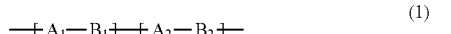
(1)

In Formula 1, m and n satisfy the relations $1 \leq m < 190$, $0 \leq n < 190$ and $1 \leq m+n < 190$, $A_1$ may include at least one of

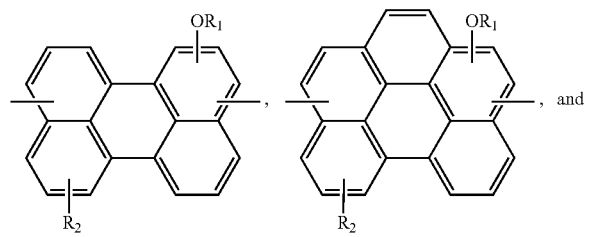
, and

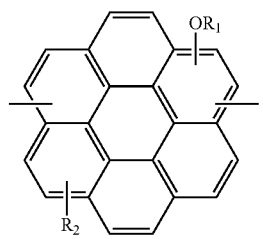

(in which each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group (—$NH_2$), an alkoxy group (—OR) (R may be a $C_1$-$C_{10}$ alkyl or $C_6$-$C_{10}$ aryl group), or a dialkylamino group (—NRR') (R and R' may each independently be a $C_1$-$C_{10}$ alkyl or $C_6$-$C_{10}$ aryl group)), $A_2$ may include at least one of

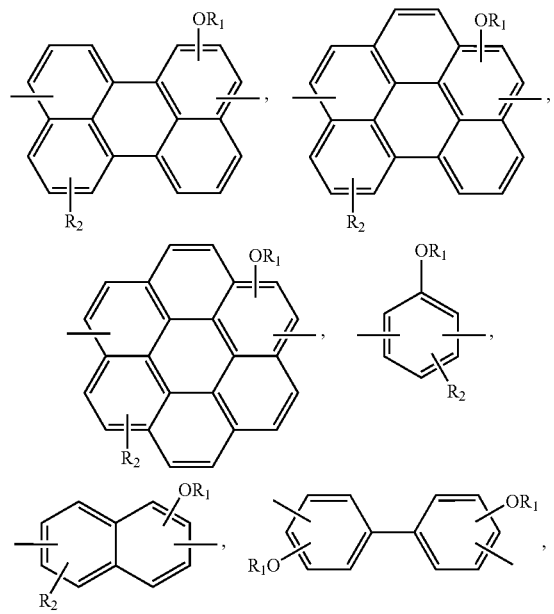

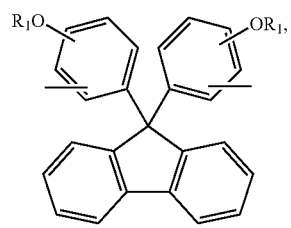

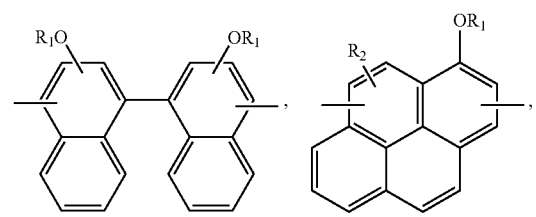

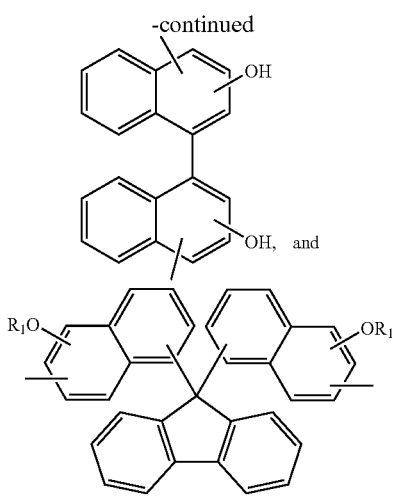

(in which each R₁ represents a hydrogen atom, a $C_1$-$C_{10}$ alkyl group, a $C_6$-$C_{10}$ aryl group, an allyl group or a halogen atom, and each R₂ represents a hydrogen atom, a hydroxyl group, an amino group (—NH₂), an alkoxy group (—OR) (R may be a $C_1$-$C_{10}$ alkyl or $C_6$-$C_{10}$ aryl group) or a dialkylamino group (—NRR') (R and R' may each independently be a $C_1$-$C_{10}$ alkyl or $C_6$-$C_{10}$ aryl group)), and B₁ and B₂ may each independently include at least one of —CH₂—,

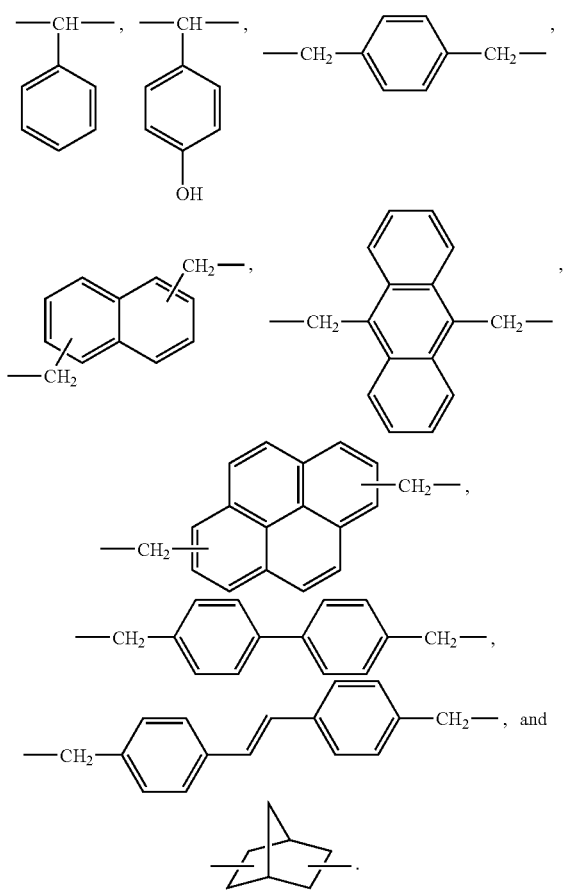

In Formula 1, A₁ and A₂ may be identical to or different from each other, and B₁ and B₂ may be identical to or different from each other. When n is not zero, the polymer of Formula 1 may be a random, block or alternating copolymer. The polymer of Formula 1 is preferably a random copolymer.

The polymer of Formula 1 is characterized by the presence of aromatic rings with a strong absorption in the short wavelength region (particularly, 193 and 248 nm) and may be useful as a component for a hardmask composition.

Embodiments also provide a hardmask composition with antireflective properties including (a) the aromatic ring-containing polymer of Formula 1 or its mixture with an aromatic ring-containing polymer represented by Formula 2:

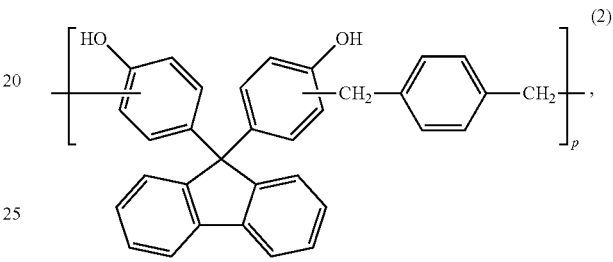

wherein 1≦p<190, and (b) an organic solvent.

The mixture of the polymers of Formulae 1 and 2 may produce synergistic effects on etch resistance required in patterning an underlying layer. In this case, a hardmask composition using the polymer mixture in an appropriate ratio may exhibit excellent characteristics in terms of solubility in a solvent (e.g., propylene glycol monomethyl ether acetate (PGMEA)), storage stability, and solvent resistance after application and baking, which may be further enhanced with respect to the hardmask composition using the polymer of Formula 1 only.

The mixing weight ratio of the polymer of Formula 1 to the polymer of Formula 2 may be about 10:90 to about 90:10 and preferably about 25:75 to about 75:25.

It is preferred that the aromatic rings of the polymer 1 or 2 are present in the skeleton of the polymer. Since the aromatic rings absorb radiation of short wavelengths (e.g., about 248 nm or below) during lithography, the composition of an embodiment may be used to form a hardmask layer capable of minimizing the reflectivity between a resist and an underlying layer. This may eliminate the need for an additional antireflective coating (ARC) layer.

The functional groups (—OR₁, R₂) of the polymer may react with the terminal functional groups of the polymer (for example, alkoxy groups) to induce self-crosslinking of the polymer. This self-crosslinking may allow the hardmask composition of an embodiment to be cured by baking even without the use of an additional crosslinking component.

The aromatic ring-containing polymer of Formula 1 may have a number of —OR₁, (e.g., hydroxyl groups) groups or —R₂ groups as reactive sites, distributed along the backbone chain of the polymer, that react with a crosslinking component. Accordingly, the curing of the composition according to an embodiment may be promoted by crosslinking with a crosslinking component, rather than just self-crosslinking.

Taking into consideration the physical properties (e.g., coatability) that may be required for the hardmask composition, the polymer of Formula 1, or its mixture with the polymer of Formula 2, preferably has a weight average molecular weight of about 1,000 to about 30,000.

Further, the hardmask composition of an embodiment may have solution- and film-forming properties, which may assist in the formation of a layer by a conventional spin-coating technique.

The polymer of Formula 1 and its mixture with the polymer of Formula 2 (a) is preferably present in an amount of about 1 to about 30 parts by weight, based on 100 parts by weight of the organic solvent. Maintaining the amount of polymer at about 1 parts by weight or greater to about 30 parts by weight or less may help ensure that a desired coating thickness is attained.

There is no particular limitation on the kind of the organic solvent so long as the aromatic ring-containing polymer may be sufficiently dissolved in the organic solvent. Suitable organic solvents may include at least one of propylene glycol monomethyl ether acetate (PGMEA), cyclohexanone, and ethyl lactate.

The hardmask composition of an embodiment may further include a crosslinking component and an acid catalyst.

The crosslinking component is preferably one capable of crosslinking the repeating units of the polymer upon heating in a reaction catalyzed by a generated acid. The acid catalyst is preferably thermally activated.

As the acid catalyst, an organic acid, e.g., p-toluenesulfonic acid monohydrate, may be used. In view of storage stability, a thermal acid generator (TAG) may be used as the acid catalyst. A TAG is a compound that generates an acid upon thermal treatment. Preferably, the TAGs include pyridinium p-toluenesulfonate, 2,4,4,6-tetrabromocyclohexadienol, benzoin tosylate, 2-nitrobenzyl tosylate, and alkyl esters of organic sulfonic acids. Other suitable radiation-sensitive acid catalysts known in the field of resists may also be used, so long as they are compatible with the other components of the hardmask composition.

Any suitable crosslinking component capable of reacting with the —OR$_1$, (e.g., hydroxyl groups) or R$_2$ groups of the aromatic ring-containing polymer in a manner that can be catalyzed by an acid generated from the acid catalyst (d) may be used.

Crosslinking components suitable for use in the hardmask composition of an embodiment may include at least one of etherified amino resins, methylated melamine resins (e.g., N-methoxymethyl-melamine resins), butylated melamine resins (e.g., N-butoxymethyl-melamine resins), methylated and butylated urea resins (e.g., Cymel U-65 Resin and UFR 80 Resin), glycoluril derivatives (e.g., Powderlink 1174, Cytec Industries Inc.), and 2,6-bis(hydroxymethyl)-p-cresol.

Powderlink 1174 is represented by Formula 3:

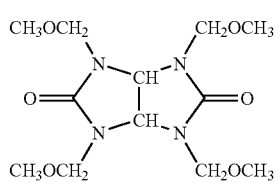

(3)

The crosslinking component may include the bisepoxy compound of Formula 4:

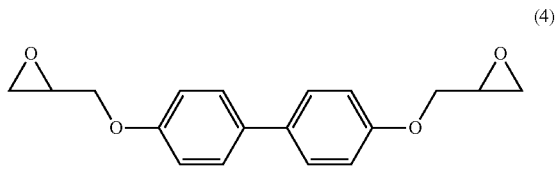

(4)

In the hardmask composition of an embodiment, the polymer of Formula 1, or its mixture with the polymer of Formula 2, is preferably present in an amount of about 1 to about 20% by weight, and more preferably about 3 to about 10% by weight. The organic solvent is preferably present in an amount of about 75 to about 98.8% by weight. The crosslinking component is preferably present in an amount of about 0.1 to about 5% by weight, and more preferably about 0.1 to about 3% by weight. The acid catalyst is preferably present in an amount of about 0.001 to about 0.05% by weight, and more preferably about 0.001 to about 0.03% by weight.

Maintaining the amount of the polymer of Formula 1, or its mixture with the polymer of Formula 2, at about 1% by weight or greater and about 20% by weight or less may help ensure that a desired coating thickness is attained.

Maintaining the amount of the crosslinking component at about 0.1% by weight or greater may help ensure that crosslinking properties are exhibited. Maintaining the amount of the crosslinking component at about 5% by weight or less may help ensure that the optical properties of the coating film may be affected.

Maintaining the amount of the acid catalyst at about 0.001% by weight or greater may help ensure that crosslinking properties are exhibited. Maintaining the amount of the acid catalyst at about 0.05% by weight or less may help ensure that the storage stability of the composition is not adversely affected.

Maintaining the amount of the organic solvent at about 75% by weight or greater and about 98.8% by weight or less may help ensure that a desired coating thickness is attained.

The hardmask composition of an embodiment may further include at least one additive, e.g., a surfactant.

Embodiments also provide a method for patterning an underlying material layer on a substrate by using the hardmask composition.

The method may include providing a material layer on a substrate, forming an antireflective hardmask layer using the composition on the material layer, forming a radiation-sensitive imaging layer on the antireflective hardmask layer, patternwise exposing the radiation-sensitive imaging layer to radiation to form a pattern of radiation-exposed regions in the imaging layer, selectively removing portions of the radiation-sensitive imaging layer and the hardmask layer to expose portions of the material layer, and etching the exposed portions of the material layer to pattern the material layer.

The method may further include forming a silicon-containing hardmask layer prior to forming a radiation-sensitive imaging layer on the antireflective hardmask layer.

The method may further include forming a bottom antireflective coating (BARC) layer on the silicon-containing hardmask layer prior to forming a radiation-sensitive imaging layer on the antireflective hardmask layer.

The method may be carried out in accordance with the following procedure. First, a material (e.g., aluminum or silicon nitride (SiN)) to be patterned may be applied to a silicon substrate by any suitable technique known in the art. The material may include an electrically conductive, semi-conductive, magnetic, or insulating material.

Thereafter, the hardmask composition of an embodiment may be spin-coated to a thickness of about 500 to about 4,000 Å and baked at about 100 to about 300° C. for about 10 seconds to about 10 minutes to form a hardmask layer. Thereafter, a silicon-containing hardmask composition may be spin-coated to a thickness of about 500 to about 4,000 Å on the hardmask layer and baked at about 100 to about 300° C. for about 10 seconds to about 10 minutes to form a silicon-containing hardmask layer. If needed, a bottom antireflective coating (BARC) layer may be formed on the silicon-containing hardmask layer.

A radiation-sensitive image layer may be formed on the hardmask layer. Light exposure and development may be performed to form a pattern on the imaging layer. Exposed portions of the material layer may be dry-etched using a gas mixture, e.g., $CHF_3/CF_4$, to form a pattern on the silicon-containing hardmask layer. After the dry etching, the exposed portions of the hardmask layer may be etched using a gas mixture, e.g., $BCl_3/Cl_2$, to pattern the hardmask layer.

The exposed potions of the material layer may be dry-etched using a gas mixture, e.g., $CHF_3/CF_4$, to pattern the material layer. A plasma (e.g., oxygen plasma) may be used to remove the remaining material, leaving the patterned material layer only. The method of an embodiment may be used for the fabrication of a semiconductor integrated circuit device.

Accordingly, the composition of an embodiment and the resulting lithographic structure may be used for the fabrication and design of integrated circuit devices. For example, the composition of an embodiment may be used in the formation of patterned material layer structures, e.g., metal wirings, holes for contacts and biases, insulating sections (e.g., damascene trenches (DTs) and shallow trench isolation (STI)), and trenches for capacitor structures.

Hereinafter, embodiments will be explained in more detail with reference to the following examples. However, these examples are given for the purpose of illustration only and are not intended to limit the scope of the invention.

EXAMPLES

Synthesis Example 1

A 500 ml three-neck flask equipped with a thermometer, a condenser, a mechanical agitator, and a dropping funnel was immersed in an oil bath at 140° C. Heating and magnetic stirring were conducted on a hot plate and the temperature of cooling water in the condenser was adjusted to 40° C. 26.8 g (0.1 mol) of 1-hydroxyperylene and 16.6 g (0.1 mol) of 1,4-bismethoxymethylbenzene (MMB) were sequentially added to the reactor, and dissolved in 65.6 g of propylene glycol monomethyl ether acetate (PGMEA). To the solution was added 0.77 g (5 mmol) of diethyl sulfate (DS).

The temperature of the reactor was maintained at 130° C. The molecular weight of the reaction mixture was measured at regular time intervals during polymerization to determine the time when the reaction was finished. For the measurement of the molecular weight, 1 g of the reaction mixture was sampled from the reactor and rapidly cooled to room temperature. 0.02 g of the sample was diluted with tetrahydrofuran (THF) until the solids content became 4 wt %. At the time when the reaction was finished, 4.48 g (0.03 mol) of triethanolamine as a neutralizing agent was added to the reactor and stirred to quench the reaction. The reaction mixture was slowly cooled to room temperature.

The reaction mixture was diluted with 50 g of PGMEA and transferred to a 2,000 ml separatory funnel. The polymer solution was added dropwise with vigorous stirring to 4 kg of an alcoholic mixture of methanol and ethylene glycol (90:10 (g/g)). The polymer product was collected at the bottom of the flask and the supernatant was separately stored. The methanol was removed from the reaction solution using a rotary evaporator at 60° C. for 10 minutes, affording a copolymer of Formula 5:

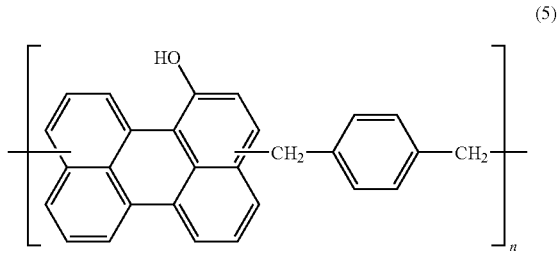

(5)

wherein n was an average of 10.

The molecular weight and the polydispersity of the copolymer were measured by gel permeation chromatography (GPC) in tetrahydrofuran. The copolymer was found to have a molecular weight of 4,000 and a polydispersity of 2.3.

Synthesis Example 2

A copolymer of Formula 6 was synthesized in the same manner as in Synthesis Example 1, except that 3 g (0.1 mol) of paraformaldehyde was added to the reactor instead of 16.6 g of 1,4-bismethoxymethylbenzene (MMB).

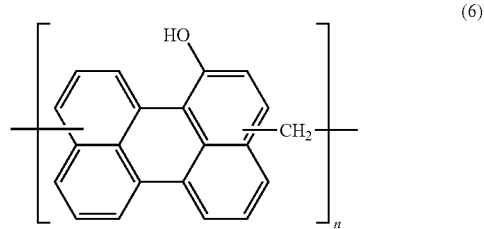

(6)

(wherein n was an average of 10)

The molecular weight and the polydispersity of the copolymer were measured by GPC in tetrahydrofuran. The copolymer was found to have a molecular weight of 3,000 and a polydispersity of 2.2.

Synthesis Example 3

A copolymer of Formula 7 was synthesized in the same manner as in Synthesis Example 1, except that 1.5 g (0.05 mol) of paraformaldehyde and 8.3 g (0.05 mol) of 1,4-bismethoxymethylbenzene were added to the reactor instead of 16.6 g (0.1 mol) of 1,4-bismethoxymethylbenzene (MMB).

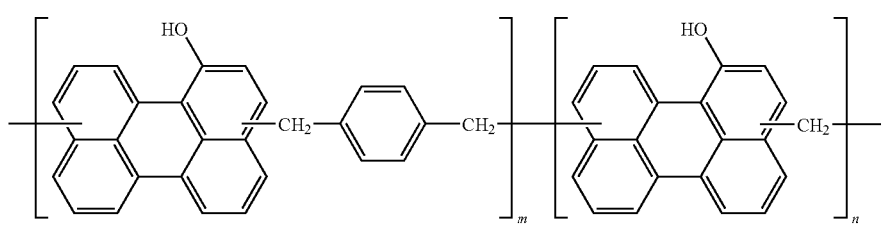

(wherein n+m was an average of 10)

The molecular weight and the polydispersity of the copolymer were measured by GPC in tetrahydrofuran. The copolymer was found to have a molecular weight of 3,500 and a polydispersity of 2.3.

Synthesis Example 4

A copolymer of Formula 8 was synthesized in the same manner as in Synthesis Example 1, except that 13.4 g (0.05 mol) of 1-hydroxyperylene and 7.2 g (0.05 mol) of 1-naphthol were added to the reactor instead of 26.8 g (0.1 mol) of 1-hydroxyperylene.

The molecular weight and the polydispersity of the copolymer were measured by GPC in tetrahydrofuran. The copolymer was found to have a molecular weight of 3,600 and a polydispersity of 2.5.

Synthesis Example 6

A copolymer of Formula 10 was synthesized in the same manner as in Synthesis Example 1, except that 10 g (0.03 mol) of coronenol and 5.0 g (0.03 mol) of 1,4-bismethoxymethylbenzene (MMB) were used as monomers.

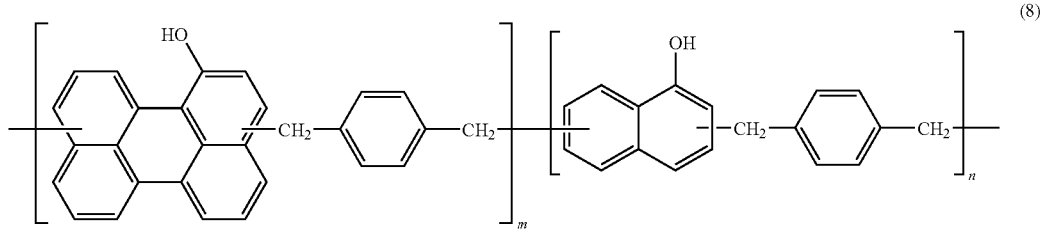

(wherein m+n was an average of 12)

The molecular weight and the polydispersity of the copolymer were measured by GPC in tetrahydrofuran. The copolymer was found to have a molecular weight of 4,200 and a polydispersity of 2.6.

Synthesis Example 5

A copolymer of Formula 9 was synthesized in the same manner as in Synthesis Example 1, except that 9.0 g (0.03 mol) of benzo[ghi]perylen-7-ol and 5.0 g (0.03 mol) of 1,4-bismethoxymethylbenzene (MMB) were used as monomers.

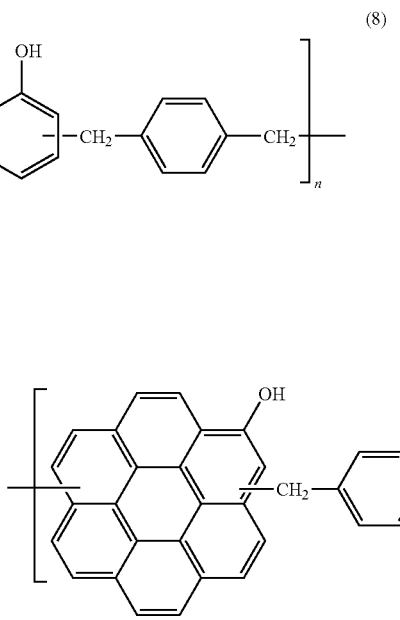

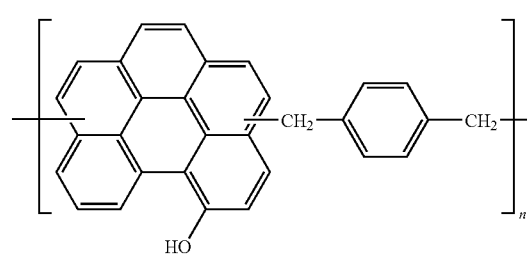

(wherein n was an average of 8)

(wherein n was an average of 7)

The molecular weight and the polydispersity of the copolymer were measured by GPC in tetrahydrofuran. The copolymer was found to have a molecular weight of 3,200 and a polydispersity of 2.4.

Examples 1, 2, 3, 4, 5 and 6

0.8 g of each of the polymers prepared in Synthesis Examples 1 to 6, 0.2 g of Powderlink 1174 (Formula 3, Cytec Industries Inc.) as a crosslinker and 2 mg of pyridinium p-toluenesulfonate were dissolved in 9 g of propylene glycol monomethyl ether acetate (PGMEA), and filtered to prepare a sample solution.

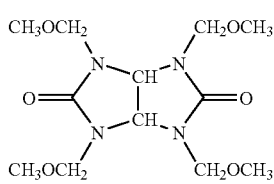

(3)

Each of the sample solutions was spin-coated on a silicon wafer and baked at 240° C. for 60 seconds to form a 3,000 Å-thick film.

The refractive index (n) and the extinction coefficient (k) of the films were measured using an ellipsometer (J. A. Woollam). The results are shown in Table 1.

The data of Table 1 show that the films are suitable for use as antireflective films at wavelengths of 193 nm (ArF) and 248 nm (KrF).

Comparative Synthesis Example 1

8.75 g (0.05 mol) of α,α'-dichloro-p-xylene, 26.66 g of aluminum chloride and 200 g of γ-butyrolactone were well stirred in a 1 L four-neck flask equipped with a mechanical agitator, a condenser, a 300 ml dropping funnel and a nitrogen inlet tube while feeding nitrogen into the flask. After 10 minutes, to the mixture was slowly added dropwise a solution of 35.03 g (0.10 mol) of 4,4'-(9-fluorenylidene)diphenol in 200 g of γ-butyrolactone for 30 minutes. The resulting mixture was allowed to react for 12 hours. After completion of the reaction, water was used to remove acids from the reaction mixture, followed by concentration using an evaporator. The concentrate was diluted with methyl amyl ketone (MAK) and methanol to obtain a 15 wt % solution in MAK/methanol (4/1 (w/w)). The solution was transferred to a 3 liter separatory funnel, and then n-heptane was added thereto to remove low-molecular weight compounds containing the monomers, affording the polymer of Formula 2 ($M_w$=12,000, polydispersity=2.0, n=23).

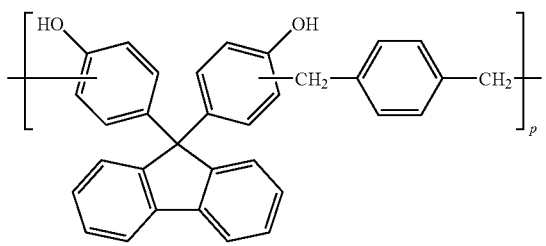

(2)

Comparative Example 1

0.8 g of the polymer prepared in Comparative Synthesis Example 1, 0.2 g of a crosslinker (Cymel 303, Cytec Industries Inc.) and 2 mg of pyridinium p-toluenesulfonate were dissolved in 9 g of PGMEA, and filtered to prepare a sample solution.

The sample solution was spin-coated on a silicon wafer and baked at 240° C. for 60 seconds to form a 3,000 Å-thick film.

The refractive index (n) and the extinction coefficient (k) of the film were measured using an ellipsometer (J. A. Woollam). The results are shown in Table 1 in FIG. 14.

The results of Table 1 reveal that the film had a refractive index and an absorbance (extinction coefficient) suitable for use as an antireflective film at 193 nm (KrF) but showed a relatively low absorbance at 248 nm (KrF).

Examples 7, 8, 9, 10, 11 and 12

Each of the sample solutions prepared in Examples 1 to 6 was spin-coated on an aluminum-coated silicon wafer and baked at 240° C. for 60 seconds to form a 3,000 Å thick film.

A KrF photoresist was coated on the film, baked at 110° C. for 60 seconds, exposed to light in an exposure system (XT: 1400, NA 0.93, manufactured by ASML), and developed with an aqueous solution of TMAH (2.38 wt %) to form a 90-nm line and space pattern. The patterns were observed using a field emission scanning electron microscope (FE-SEM) and measured for exposure latitude (EL) margin as a function of exposure energy and depth of focus (DoF) margin as a function of the distance from a light source. The results are recorded in Table 2.

The results show that the patterns showed good results in terms of profile and margins.

Comparative Example 2

The sample solution prepared in Comparative Example 1 was spin-coated on an aluminum-coated silicon wafer and baked at 240° C. for 60 seconds to form a 3,000 Å thick film.

A KrF photoresist was coated on the film, baked at 110° C. for 60 seconds, exposed to light in an exposure system (XT: 1400, NA 0.93, manufactured by ASML), and developed with an aqueous solution of TMAH (2.38 wt %) to form a 90-nm line and space pattern. The pattern was observed using a field emission scanning electron microscope (FE-SEM) and measured for exposure latitude (EL) margin as a function of exposure energy and depth of focus (DoF) margin as a function of the distance from a light source. The results are recorded in Table 2 in FIG. 15.

The results show that the pattern showed relatively poor results in terms of profile and margins, which are thought to be due to the difference in the absorption characteristics at a wavelength of 248 nm (KrF).

Examples 13, 14, 15, 16, 17 and 18

Each of the patterned specimens of Examples 7 to 12 was dry-etched using a gas mixture of $CHF_3/CF_4$, and further dry-etched using a gas mixture of $BCl_3/Cl_2$. Thereafter, O2 was used to remove all remaining organic materials. The cross sections of the specimens were observed using an FE-SEM. The results are listed in Table 3.

The results in Table 3 show that the etched patterns all showed good profiles and high etch selectivity.

Comparative Example 3

The patterned specimen of Comparative Example 2 was dry-etched using a gas mixture of $CHF_3/CF_4$, and further dry-etched using a gas mixture of $BCl_3/Cl_2$. Thereafter, O2 was used to remove all remaining organic materials. The cross section of the specimen was observed using an FE-SEM. The result is listed in Table 3 in FIG. 16.

The etched pattern was tapered in profile. This tapering is believed to be due to low etch selectivity under the etch conditions.

As is apparent from the above description, the hardmask composition of an embodiment may be used to form a film having a refractive index and an absorbance suitable for use as an antireflective film in the deep UV (DUV) (e.g., ArF (193 nm) and KrF (248 nm)), so that the reflectivity between a resist and an underlying layer can be minimized. In addition, since the hardmask composition of an embodiment exhibits high etch selectivity and is sufficiently resistant to multiple etching during lithography, it can be used to provide a lithographic structure that has better results in terms of pattern profile and margins.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A polymer composition, comprising:
an aromatic ring-containing polymer represented by Formula 1:

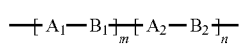
(1)

wherein m and n satisfy the relations $1 \leq m < 190$, $0 \leq n < 190$, and $1 \leq m+n < 190$, $A_1$ includes at least one of

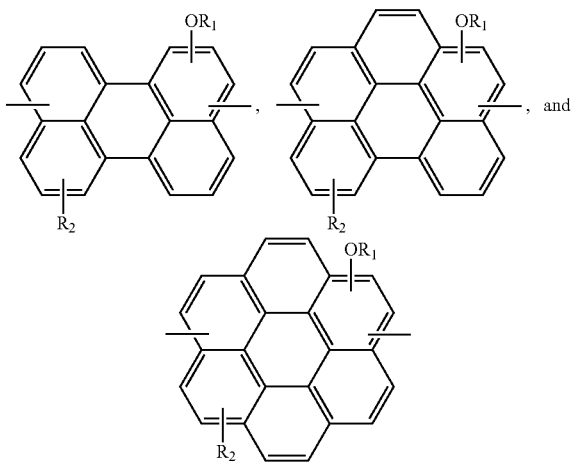

wherein, in

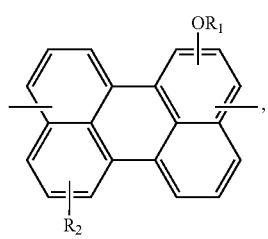

(each $R_1$ represents a hydrogen atom, an allyl group, or a halogen atom, and each $R_2$ represents a hydrogen atom, a hydroxyl group, an amino group ($-NH_2$), an alkoxy group ($-OR$) (R is a $C_1$-$C_{10}$ alkyl or $C_6$-$C_{10}$ aryl group), or a dialkylamino group ($-NRR'$) (R and R' are each independently a $C_1$-$C_{10}$ alkyl or $C_6$-$C_{10}$ aryl group), wherein, in

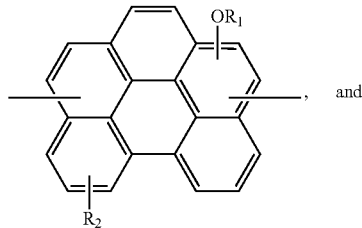, and

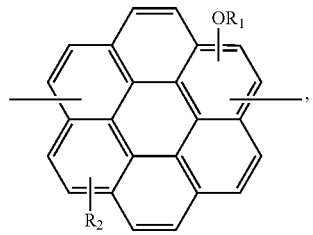, each $R_1$ represents a hydrogen atom, a $C_1$-$C_{10}$ alkyl group, a $C_6$-$C_{10}$ aryl group, an allyl group, or a halogen atom, and each $R_2$ represents a hydrogen atom, a hydroxyl group, an amino group ($-NH_2$), an alkoxy group ($-OR$) (R is a $C_1$-$C_{10}$ alkyl or $C_6$-$C_{10}$ aryl group), or a dialkylamino group ($-NRR'$) (R and R' are each independently a $C_1$-$C_{10}$ alkyl or $C_6$-$C_{10}$ aryl group), $A_2$ includes at least one of

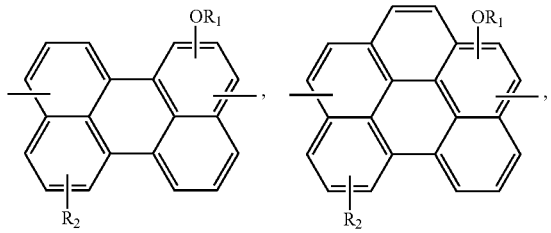

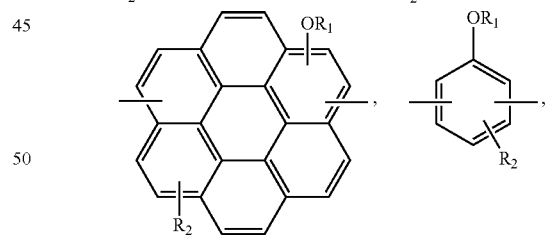

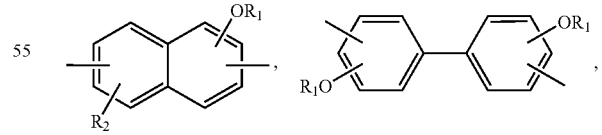

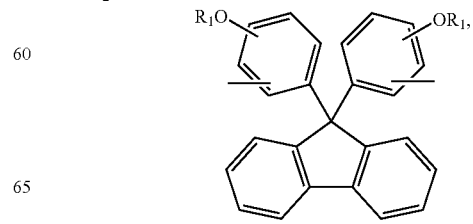

-continued

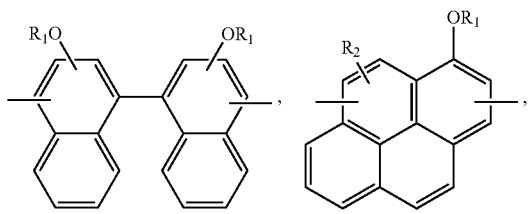

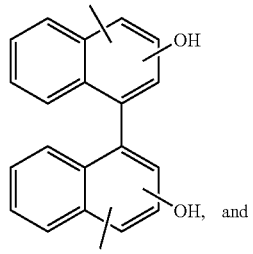

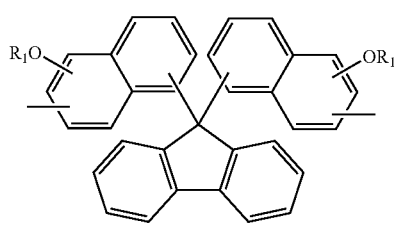

wherein, in

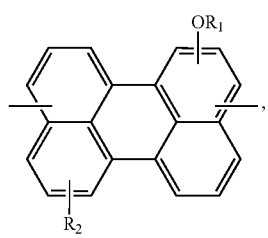

(each R₁ represents a hydrogen atom, an allyl group, or a halogen atom, and each R₂ represents a hydrogen atom, a hydroxyl group, an amino group (—NH₂), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), wherein, in

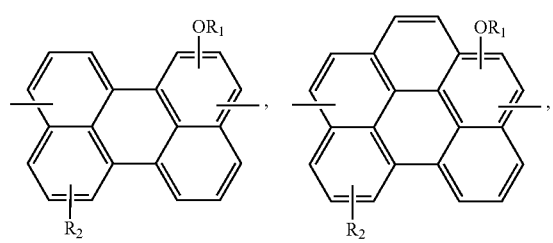

-continued

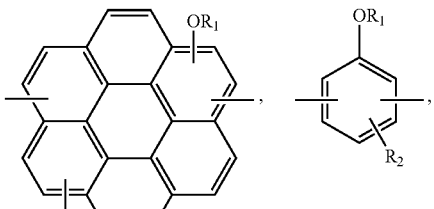

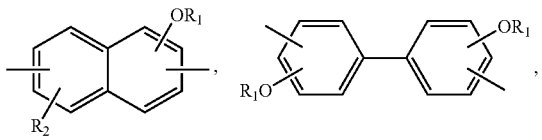

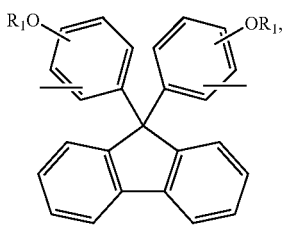

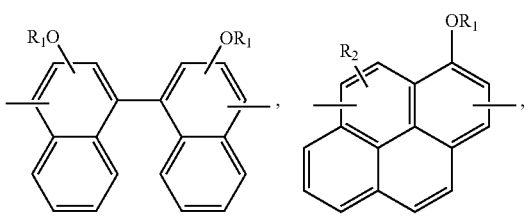

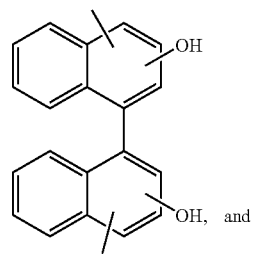

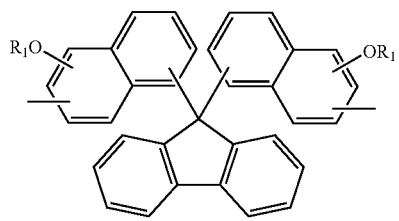

each R₁ represents a hydrogen atom, a $C_1$-$C_{10}$ alkyl group, a $C_6$-$C_{10}$ aryl group, an allyl group, or a halogen atom, and each R₂ represents a hydrogen atom, a hydroxyl group, an amino group (—NH₂), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group), and $B_1$ and $B_2$ each independently include at least one of
—$CH_2$—,

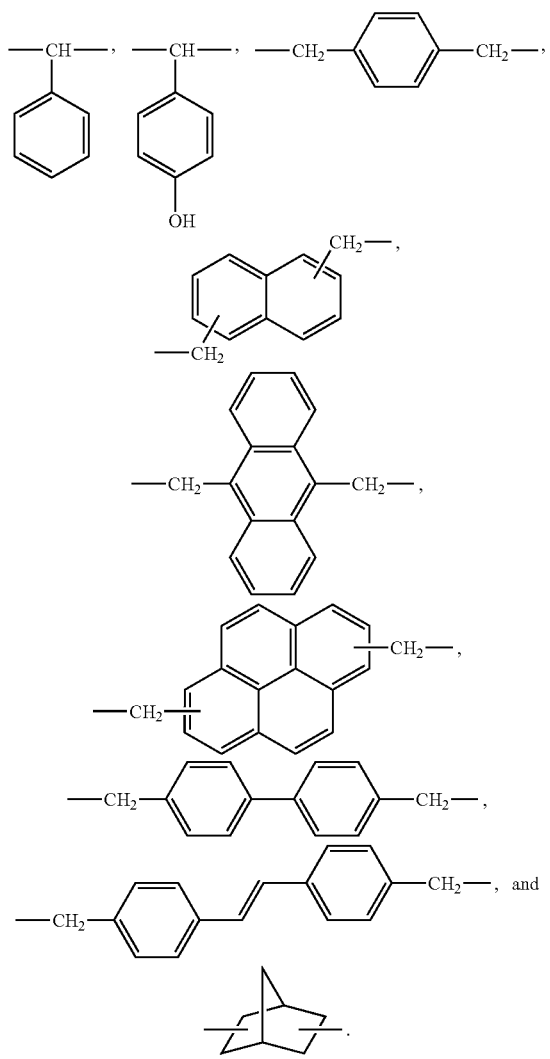

2. The polymer composition as claimed in claim 1, further comprising an aromatic ring-containing polymer represented by Formula 2:

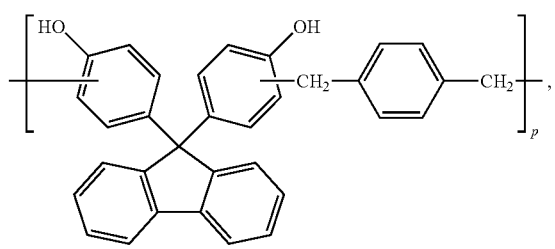

(2)

wherein $1 \leq p < 190$, the composition includes about 10 to about 90% by weight of the aromatic ring-containing polymer represented by Formula 1, and the composition includes about 10 to about 90% by weight of the aromatic ring-containing polymer represented by Formula 2.

3. A hardmask composition with antireflective properties, comprising:

a polymer composition, including an aromatic ring-containing polymer represented by Formula 1:

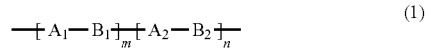

(1)

wherein m and n satisfy the relations $1 \leq m < 190$, $0 \leq n < 190$, and $1 \leq m+n < 190$, $A_1$ includes at least one of

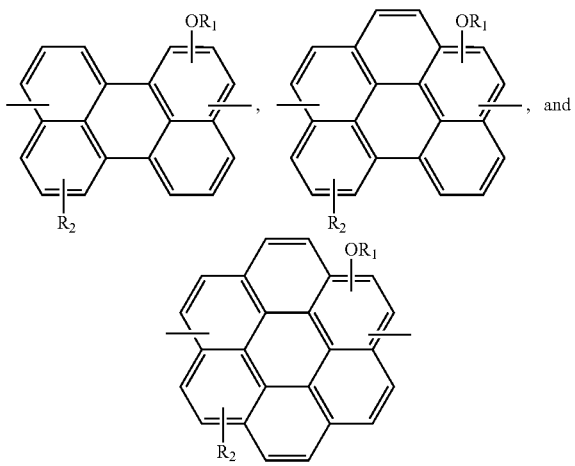

wherein, in

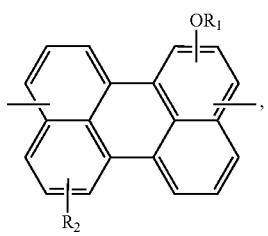

(each $R_1$ represents a hydrogen atom, an allyl group, or a halogen atom, and each $R_2$ represents a hydrogen atom, a hydroxyl group, an amino group (—$NH_2$), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group), wherein, in

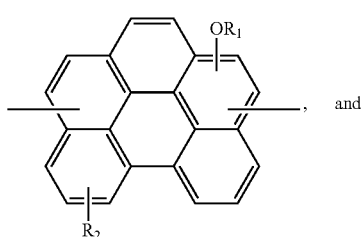

27
-continued

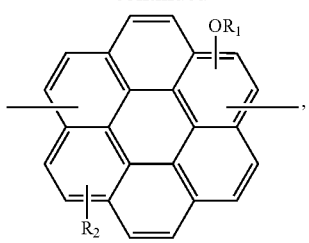

each R₁ represents a hydrogen atom, a $C_1$-$C_{10}$ alkyl group, a $C_6$-$C_{10}$ aryl group, an allyl group, or a halogen atom, and each R₂ represents a hydrogen atom, a hydroxyl group, an amino group (—NH₂), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group), A₂ includes at least one of

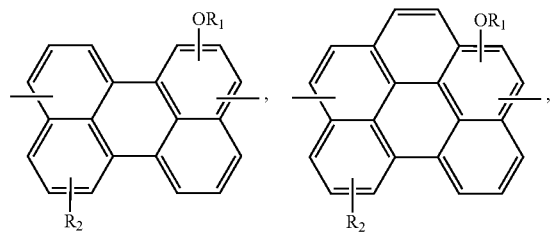

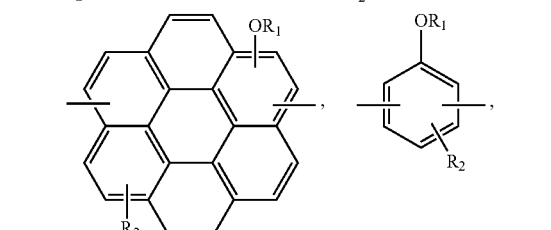

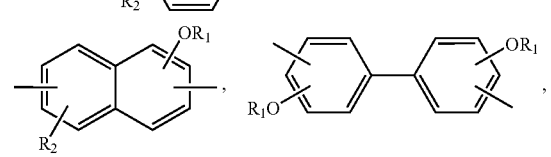

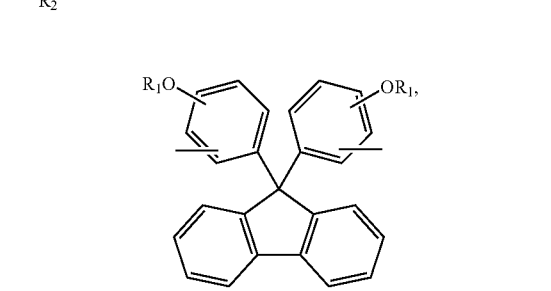

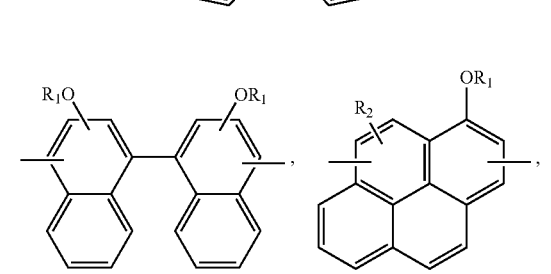

28
-continued

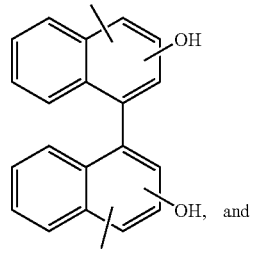

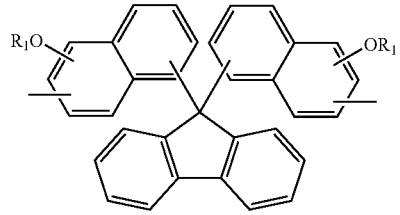

wherein, in

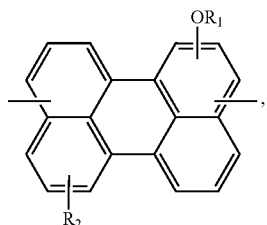

(each R₁ represents a hydrogen atom, an allyl group, or a halogen atom, and each R₂ represents a hydrogen atom, a hydroxyl group, an amino group (—NH₂), an alkoxy group (—OR) (R is a $C_1$-$C_{10}$ alkyl or $C_6$-$C_{10}$ aryl group), or a dialkylamino group (—NRR') (R and R' are each independently a $C_1$-$C_{10}$ alkyl or $C_6$-$C_{10}$ aryl group)), wherein, in

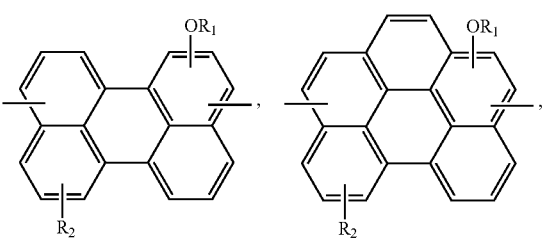

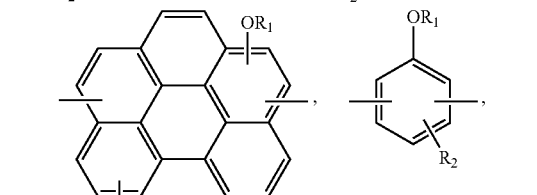

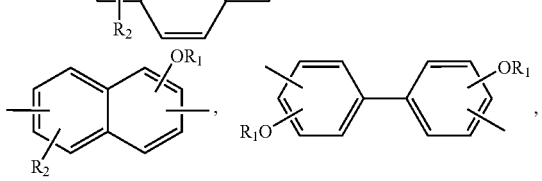

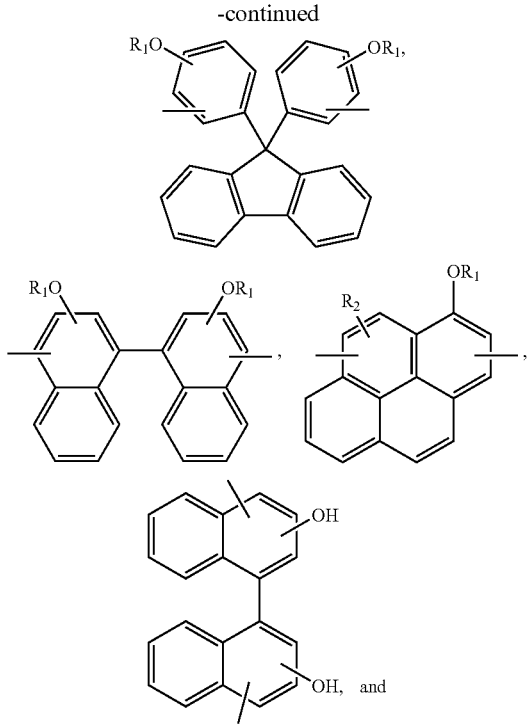

each R$_1$ represents a hydrogen atom, a C$_1$-C$_{10}$ alkyl group, a C$_6$-C$_{10}$ aryl group, an allyl group, or a halogen atom, and each R$_2$ represents a hydrogen atom, a hydroxyl group, an amino group (—NH$_2$), an alkoxy group (—OR) (R is a C$_1$-C$_{10}$ alkyl or C$_6$-C$_{10}$ aryl group), or a dialkylamino group (—NRR') (R and R' are each independently a C$_1$-C$_{10}$ alkyl or C$_6$-C$_{10}$ aryl group), and B$_1$ and B$_2$ each independently include at least one of —CH$_2$—, an organic solvent.

4. The hardmask composition as claimed in claim 3, wherein the polymer composition further includes an aromatic ring-containing polymer represented by Formula 2:

(2)

wherein 1≦p<190.

5. The hardmask composition as claimed in claim 4, wherein a weight ratio of the polymer of Formula 1 to the polymer of Formula 2 is about 1:9 to about 9:1.

6. The hardmask composition as claimed in claim 4, wherein one or both of the polymers of Formula 1 and Formula 2 has a weight average molecular weight of about 1,000 to about 30,000.

7. The hardmask composition as claimed in claim 4, further comprising a surfactant.

8. The hardmask composition as claimed in claim 4, further comprising a crosslinking component and an acid catalyst.

9. The hardmask composition as claimed in claim 8, wherein the hardmask composition includes:
about 1 to about 20% by weight of the polymer composition,
about 75 to about 98.8% by weight of the organic solvent,
about 0.1 to about 5% by weight of the crosslinking component, and
about 0.001 to about 0.05% by weight of the acid catalyst.

10. The composition as claimed in claim 8, wherein the crosslinking component includes at least one of melamine resins, amino resins, glycoluril compounds, and bisepoxy compounds.

11. The composition as claimed in claim 8, wherein the acid catalyst includes at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

12. The hardmask composition as claimed in claim 3, wherein the polymer composition has a weight average molecular weight of about 1,000 to about 30,000.

13. The hardmask composition as claimed in claim 3, further comprising a surfactant.

14. The hardmask composition as claimed in claim 3, further comprising a crosslinking component and an acid catalyst.

15. The hardmask composition as claimed in claim 14, wherein the hardmask composition includes:
   about 1 to about 20% by weight of the polymer composition,
   about 75 to about 98.8% by weight of the organic solvent,
   about 0.1 to about 5% by weight of the crosslinking component, and
   about 0.001 to about 0.05% by weight of the acid catalyst.

16. The composition as claimed in claim 14, wherein the crosslinking component includes at least one of melamine resins, amino resins, glycoluril compounds, and bisepoxy compounds.

17. The composition as claimed in claim 14, wherein the acid catalyst includes at least one of p-toluenesulfonic acid monohydrate, pyridinium p-toluenesulfonate, 2,4,4,6-tetrabromocyclohexadienone, benzoin tosylate, 2-nitrobenzyl tosylate, and alkyl esters of organic sulfonic acids.

18. A method for patterning a material on a substrate, the method comprising
   providing a material layer on a substrate,
   forming an antireflective hardmask layer using the hardmask composition as claimed in claim 3 on the material layer,
   forming a radiation-sensitive imaging layer on the antireflective hardmask layer,
   patternwise exposing the radiation-sensitive imaging layer to radiation to form a pattern of radiation-exposed regions in the imaging layer,
   selectively removing portions of the radiation-sensitive imaging layer and the antireflective hardmask layer to expose portions of the material layer, and
   etching the exposed portions of the material layer to pattern the material layer.

19. The method as claimed in claim 18, further comprising forming a silicon-containing hardmask layer prior to forming a radiation-sensitive imaging layer on the antireflective hardmask layer.

20. The method as claimed in claim 19, further comprising forming a bottom antireflective coating (BARC) layer on the silicon-containing hardmask layer prior to forming the radiation-sensitive imaging layer.

* * * * *